(12) United States Patent
Shibuya et al.

(10) Patent No.: US 11,260,451 B2
(45) Date of Patent: Mar. 1, 2022

(54) METAL POWDER FOR METAL ADDITIVE MANUFACTURING AND MOLDED OBJECT PRODUCED USING SAID METAL POWDER

(71) Applicant: JX Nippon Mining & Metals Corporation, Tokyo (JP)

(72) Inventors: Yoshitaka Shibuya, Ibaraki (JP); Kenji Sato, Ibaraki (JP)

(73) Assignee: JX NIPPON MINING & METALS CORPORATION, Tokyo (JP)

(*) Notice: Subject to any disclaimer, the term of this patent is extended or adjusted under 35 U.S.C. 154(b) by 96 days.

(21) Appl. No.: 16/348,566

(22) PCT Filed: Jun. 21, 2018

(86) PCT No.: PCT/JP2018/023634
§ 371 (c)(1),
(2) Date: May 9, 2019

(87) PCT Pub. No.: WO2019/064745
PCT Pub. Date: Apr. 4, 2019

(65) Prior Publication Data
US 2020/0188995 A1 Jun. 18, 2020

(30) Foreign Application Priority Data
Sep. 29, 2017 (JP) .............................. JP2017-190218

(51) Int. Cl.
*B22F 1/02* (2006.01)
*B22F 1/00* (2022.01)
*B33Y 70/00* (2020.01)
*C23C 14/16* (2006.01)
*C23C 14/22* (2006.01)
*C23C 18/16* (2006.01)
*C23C 18/31* (2006.01)
*B33Y 80/00* (2015.01)

(52) U.S. Cl.
CPC ............ *B22F 1/0011* (2013.01); *B22F 1/025* (2013.01); *B33Y 70/00* (2014.12); *C23C 14/165* (2013.01); *C23C 14/223* (2013.01); *C23C 18/1637* (2013.01); *C23C 18/31* (2013.01); *B22F 2301/10* (2013.01); *B22F 2304/10* (2013.01); *B33Y 80/00* (2014.12); *Y10T 428/12181* (2015.01)

(58) Field of Classification Search
None
See application file for complete search history.

(56) References Cited

U.S. PATENT DOCUMENTS

| 5,372,845 A * | 12/1994 | Rangaswamy ........... B22F 9/04 427/216 |
| 5,956,560 A * | 9/1999 | Dorfman ................. B22F 1/025 257/E23.075 |
| 6,103,392 A | 8/2000 | Dorfman et al. |
| 6,679,937 B1 * | 1/2004 | Kodas ...................... B01J 2/003 106/287.19 |
| 10,610,928 B2 | 4/2020 | Okada et al. |
| 2010/0015467 A1 * | 1/2010 | Zimmermann ......... C23C 24/04 428/615 |
| 2010/0170595 A1 * | 7/2010 | Kaneko ..................... C22C 9/06 148/554 |
| 2014/0264191 A1 * | 9/2014 | Rantala ................... C09D 11/52 252/513 |
| 2016/0332227 A1 | 11/2016 | Tsubota et al. |
| 2018/0339335 A1 * | 11/2018 | Aixala ................... B33Y 70/00 |

FOREIGN PATENT DOCUMENTS

| JP | 2005-194566 A | 7/2005 |
| JP | 2007-211332 A | 8/2007 |
| JP | 2015-079728 A | 4/2015 |
| JP | 2015-132001 A | 7/2015 |
| JP | 2017-025392 A | 2/2017 |
| WO | 2013/118892 A1 | 8/2013 |

* cited by examiner

*Primary Examiner* — Seth Dumbris
(74) *Attorney, Agent, or Firm* — Howson & Howson LLP

(57) ABSTRACT

A metal powder in which a coating made of one or more types of elements selected from Gd, Ho, Lu, Mo, Nb, Os, Re, Ru, Tb, Tc, Th, Tm, U, V, W, Y, Zr, Cr, Rh, Hf, La, Ce, Pr, Nd, Pm, Sm and Ti is formed on a surface of a copper or copper alloy powder, wherein a thickness of the coating is 5 nm or more and 500 nm or less. A metal powder for metal additive manufacturing based on the laser method which can be efficiently melted with a laser while maintaining the high conductivity of copper or copper alloy, and a molded object produced by using such metal powder are provided.

16 Claims, No Drawings

METAL POWDER FOR METAL ADDITIVE MANUFACTURING AND MOLDED OBJECT PRODUCED USING SAID METAL POWDER

BACKGROUND

The present invention relates to a metal powder suitable for metal additive manufacturing, and a molded object produced by using such metal powder.

In recent years, attempts are being made for using metal 3D printer technology and producing metal components of three-dimensional structure having a complex shape and deemed difficult to mold. 3D printing is also referred to as additive manufacturing (AM), and is a method of producing a complex-shape metal molded object by thinly laying a metal powder on a plate to form a metal powder layer, melting the metal powder layer by scanning the metal powder layer with an electron beam or a laser beam and subsequently solidifying the metal powder layer, thinly laying a new powder thereon and similarly melting a predetermined part with a laser beam and subsequently solidifying the predetermined part, and repeating these processes.

As the metal powder for use in metal additive manufacturing, Patent Document 1 discloses a surface-treated metal powder. With this technology, by forming an organic coating on the surface of a metal powder, such as a copper powder, by using a silane coupling agent or the like, the metal powder, in a layered state, can be directly irradiated with an electron beam (EB) without partially sintering the metal powder via preliminary heating. To form a coating on the surface of the metal powder by performing surface treatment thereto as the powder for use in the EB method is effective for improving the characteristics of the powder.

CITATION LIST

[Patent Document 1] Japanese Unexamined Patent Application Publication No. 2017-25392

SUMMARY

Meanwhile, with the laser method, a laser beam is used as the heat source, and, because preliminary heating is not required as with the EB method, the characteristics required by the metal powder are different in comparison to the EB method using an electron beam. Even in the metal additive manufacturing based on the laser method, it may be possible to improve the characteristics by performing surface treatment to the metal powder, but it is necessary to consider the problems that are unique to a laser which differ from EB. In light of the above, an object of the present invention is to provide a metal powder for metal additive manufacturing based on the laser method which can be efficiently melted with a laser while maintaining the high conductivity of copper or copper alloy, and a molded object produced by using such metal powder.

In order to achieve the foregoing object, as a result of intense study, the present inventors discovered that, by coating a surface of a copper or copper alloy powder with a metal material having high absorption of a laser beam and which does not dissolve in, or which does not easily dissolve in, copper, it is possible to achieve the foregoing object; specifically, it can be efficiently melted with a laser while maintaining the high conductivity of copper or copper alloy. The present application provides the following invention based on the foregoing discovery.

1) A metal powder in which a coating made of one or more types of elements selected from Gd, Ho, Lu, Mo, Nb, Os, Re, Ru, Tb, Tc, Th, Tm, U, V, W, Y, Zr, Cr, Rh, Hf, La, Ce, Pr, Nd, Pm, Sm and Ti is formed on a surface of a copper or copper alloy powder, wherein a thickness of the coating is 5 nm or more and 500 nm or less.

2) The metal powder according to 1) above, wherein a grain size $d_{50}$ of the copper or copper alloy powder is 20 μm or more and 100 μm or less.

3) The metal powder according to 1) or 2) above, wherein an oxygen concentration of the copper or copper alloy powder is 1000 wtppm or less.

4) A metal laminate molded object produced by using the metal powder according to any one of 1) to 3) above, wherein a conductivity of the metal laminate molded object is 90% IACS or higher.

5) The metal laminate molded object according to 4) above, wherein a relative density of the metal laminate molded object is 97% or higher.

Because the coating (metal material) formed on the surface of the copper or copper alloy hardly dissolves in the copper or copper alloy, the metal powder can be efficiently melted with a laser while maintaining the high conductivity of the copper or copper alloy because of its high absorption of a laser beam used in the metal additive manufacturing, and the work efficiency can be improved. Furthermore, because the composition of the coating formed on the surface of the copper or copper alloy has a lower thermal conductivity than copper, heat of the laser beam can be used more efficiently. Moreover, as a secondary effect, because the foregoing metal material configuring the coating has a higher melting point than the copper or copper alloy, a change in quality caused by the heat of the laser beam does not occur easily, and properties of the powder can be maintained even when the powder, which did not contribute to the molding process, is recovered and reused.

DETAILED DESCRIPTION

While copper exhibits high conductivity (conductivity: 95% IACS), there is a problem in that, when the metal material configurating the coating becomes dissolved in the copper or copper alloy, it is not possible to retain its superior conductivity. Accordingly, as the metal material to be used as the coating, a metal which does not dissolve in the copper or copper alloy, or which does not easily dissolve in the copper or copper alloy, is selected. Here, the solid solution content relative to the copper is a property that is unique to the metal element, and the material can be determined from a diagram which is generally referred to as a phase diagram indicating the phase relationship of two elements relative to the temperature. The present invention uses a metal material in which the maximum solid solution content is 0.2 at % or less at a temperature that is equal to or less than the liquid phase by referring to the copper-side solid solution content in the phase diagram.

As the metal material in which the solid solution content relative to copper is 0.2 at % or less, one or more types of elements selected from Gd, Ho, Lu, Mo, Nb, Os, Re, Ru, Tb, Tc, Th, Tm, U, V, W, Y, Zr, Cr, Rh, Hf, La, Ce, Pr, Nd, Pm, Sm and Ti are preferably used. Furthermore, this metal material exhibits high absorption against a Nd:YAG laser (wavelength: 1064 nm) that is normally used in metal additive manufacturing based on the laser method. Specifically, while the absorption of copper itself is roughly 13%, when a coating is formed with these metal materials, even those with a low level of absorption exhibit absorption of 20% or higher, those with a high level of absorption exhibit absorption of 30% or higher, and those with even a higher level of absorption exhibit absorption of 40% or higher. As a result of coating the surface of the copper or copper alloy with these types of metal materials, the copper or copper alloy can be efficiently melted with a laser while maintaining the high conductivity of copper.

The copper or copper alloy powder used in metal additive manufacturing is normally several microns to several hundred microns. The thickness of the above coating to be formed on this kind of copper or copper alloy powder is preferably 5 nm or more and 500 nm or less. When the thickness of the coating is less than 5 nm, there are cases where the foregoing effect of the surface coating is not sufficiently exhibited. Meanwhile, when the thickness of the coating is 500 nm, the ratio of surface coating on the surface-treated copper or copper alloy powder will be roughly 10 wt %, but at this level, the solid solution content relative to copper can be maintained at a low level, and the high conductivity of copper in the molded object can be retained.

The thickness of the surface coating formed on the copper powder can be measured based on the depth direction analysis performed via AES (Auger Electron Spectroscopy).
[AES Analysis]
Analyzer: AES (model JAMP-7800F manufactured by JEOL Ltd.)
Vacuum attainment level: $2.0 \times 10^{-8}$ Pa
Sample angle of inclination: 30 degreesFilament current: 2.22 A
Probe voltage: 10 kV
Probe current: $2.8 \times 10^{-8}$ A
Probe diameter: approximately 500 nm
Sputtering rate: 1.9 nm/min (in terms of $SiO_2$)

As the copper or copper alloy powder, a copper or copper alloy powder having an average grain size $d_{50}$ of 20 μm or more and 100 μm or less is preferably used. When the average grain size $d_{50}$ is 20 μm or more, the powder is not blown up as easily during the molding process, and it becomes easier to handle the powder. Furthermore, by causing the average grain size $d_{50}$ to be 100 μm or less, it becomes easier to produce a high-definition laminate molded object. The term "average grain size $d_{50}$" refers to the grain size at an integrated value of 50% in a grain size distribution measured based on image analysis.

The oxygen concentration in the copper or copper alloy powder is preferably 1000 wtppm or less, more preferably 500 wtppm or less, and most preferably 250 wtppm or less. This is because, if the amount of oxygen in the copper or copper alloy powder is small, it is possible to avoid producing the molded object with oxygen contained therein, and consequently reduce the possibility of causing an adverse effect on the conductivity of the molded object. The oxygen concentration can be measured based on the inert gas melting method by using TCH600 manufactured by LECO.

While the present invention uses copper or copper alloy as the base metal of the metal powder for metal additive manufacturing, one or more types of elements selected from Cr, Bi, W, Y, Zr, and Nd contained in an amount of 12 at % or less is preferably used as the alloy component as the copper alloy. Moreover, with these metals, the solid solution content relative to copper is less than 0.2 at %, and, as described above, these metals are components that do not impair the conductivity of copper. Furthermore, the addition of these elements increases the absorption of laser and enables the efficient melting of the powder with a laser.

The surface treatment method of the copper or copper alloy powder of the present invention is now explained.

First, a required amount of copper or copper alloy powder is prepared. A powder having an average grain size $d_{50}$ of 20 to 100 μm is preferably used. The intended grain size can be obtained via sieving. The copper or alloy powder can be prepared via the atomization method, and, by adjusting the oxygen concentration of the atmosphere upon preparing the atomized powder, the oxygen content in the copper or copper alloy powder can be reduced to be 1000 wtppm or less.

Next, the surface treatment of the copper or copper alloy powder is performed. Surface treatment can be performed based on the plating method or the barrel sputtering method. With the plating method, the copper or copper alloy powder is dipped in a plating solution, and a metal plated layer is formed on the surface of the copper or copper alloy powder. Here, the plating solution can be selected according to the type of metal which forms the coating, and the thickness of the coating can be adjusted as needed by adjusting the plating time.

With the barrel sputtering method, the copper or copper alloy powder is placed in a polygonal barrel, and the metal material (target) is sputtered while rotating the barrel and a metal coating is formed on the surface of the copper powder. Here, the type of sputtering target is selected according to the type of metal or alloy to be coated. In the case of an alloy, an alloy target is used, or an alloy coating may be formed by simultaneously performing sputtering. The thickness of the surface coating can be adjusted by changing the output and time of sputtering, and the rotation speed of the barrel and so on. It is thereby possible to obtain a metal powder in which a predetermined metal coating is formed on the copper or copper alloy powder.

EXAMPLES

The present invention is now explained based on Examples and Comparative Examples. These Examples are illustrative only, and the present invention is not limited in any way based on the Examples. In other words, the present invention is limited only by the scope of its claims, and covers the various modifications other than the Examples included in the present invention.

Examples 1-5: Thickness of Surface Coating

A copper atomized powder having a grain size $d_{50}$ of 25 μm and an oxygen concentration of 750 wt % was prepared, and a zirconium coating was formed on the surface of the copper powder by using a barrel sputtering device. Here, the sputter output was set to 100 W, the rotation speed of the barrel was set to 4 rpm, and the thickness of the coating was changed by adjusting the sputter time. Examples 1-5 are cases where the respective thicknesses were changed to 5 nm, 50 nm, 100 nm, 300 nm, and 500 nm.

The absorption of a laser beam having a wavelength of 1064 nm was measured by using a spectrophotometer (U-4100 manufactured by Hitachi, Ltd.) with regard to the copper powder with a coating formed thereon. The results are shown in Table 1. It was confirmed that the absorption was higher in all Examples 1-5 in comparison to the copper powder with no coating formed thereon (Comparative Example 1). Furthermore, it is evident that the absorption increases as the thickness becomes thicker.

Next, a metal additive manufacturing device (manufactured by Concept Laser) was used to produce a molded object (90 mm×40 mm×20 mm), and the conductivity of the molded object was measured by using a commercially available vortex flow conductivity meter. Consequently, the molded objects exhibited favorable conductivity in all cases at a value of 90% IACS or higher. Incidentally, IACS (International Annealed Copper Standard) prescribes the conductivity of an internationally adopted annealed copper standard (volume resistivity: $1.7241×10^{-2}$ μΩcm) as 100% IACS, for the criterion of electrical resistance (or electrical conductivity).

Moreover, the relative density of each molded object was measured. The measured density of the molded object was measured using the Archimedes method, and performed based on "JISZ2501: Sintered metal material—Density, oil percentage and open porosity testing method". Water was used as the liquid. As a result of calculating the relative density (=theoretical density/measured density×100) with the theoretical density as 8.94, a high density of 97% or higher was obtained in all cases.

Furthermore, a molded object (90 mm×40 mm×20 mm) was produced using the powder (unmolded powder) which was recovered as a result of not contributing to the molding even though it was used for molding in 4 or more occasions. The relative density and conductivity of this molded object were similarly measured and, while a slight decrease in density was observed, the molded objects exhibited favorable conductivity in all cases at a value of 90% IACS or higher.

Examples 6-31: Type of Metal of Surface Coating

A copper atomized powder having a grain size $d_{50}$ of 25 μm and an oxygen concentration of 750 wt % was prepared, and a coating was formed on the surface of the copper powder by using a barrel sputtering device upon changing the type of metal (Gd, Ho, Lu, Mo, Nb, Os, Re, Ru, Tb, Tc, Th, Tm, U, V, W, Y, Zr, Cr, Rh, Hf, La, Ce, Pr, Nd, Pm, Sm). The sputter conditions and the rotation speed of the barrel were adjusted so as to attain a coating thickness of 100 nm.

With regard to the copper powder with the coating formed thereon, the absorption of a laser beam having a wavelength of 1064 nm was measured in the same manner as Example 1. The results are shown in Table 1. It was confirmed that the absorption was higher in all Examples 6-31 in comparison to the copper powder with no coating formed thereon (Comparative Example 1). Furthermore, the respective metal powders were used to produce molded objects in the same manner as Example 1, and the relative density and conductivity thereof were measured. As shown in Table 1, the relative density was 97% or higher and a high density was obtained in all cases, and the conductivity was also favorable in all cases at a value of 90% IACS or higher. Moreover, while a slight decrease in density was observed in the molded objects produced using the unmolded powder, the molded objects exhibited favorable conductivity in all cases at a value of 90% IACS or higher.

Examples 32-37: Formation of Coating Based on Plating Treatment or Chemical Conversion Treatment A copper atomized powder having a grain size $d_{50}$ of 25 μm and an oxygen concentration of 750 wt % was prepared, and a metal (Cr, Ru, Rh, Os, Ti) coating was formed on the surface of the copper powder via plating treatment or chemical conversion treatment (chromate treatment, titanate treatment). The various treatment conditions were adjusted so as to attain a coating thickness of 100 nm.

With regard to the copper powder with the coating formed thereon, the absorption of a laser beam having a wavelength of 1064 nm was measured in the same manner as Example 1. The results are shown in Table 1. It was confirmed that the absorption was higher in all Examples 32-37 in comparison to the copper powder with no coating formed thereon (Comparative Example 1). Furthermore, the respective metal powders were used to produce molded objects in the same manner as Example 1, and the relative density and conductivity thereof were measured. As shown in Table 1, the relative density was 97% or higher and a high density was obtained in all cases, and the conductivity was also favorable in all cases at a value of 90% IACS or higher. Moreover, while a slight decrease in density was observed in the molded objects produced using the unmolded powder, the molded objects exhibited favorable conductivity in all cases at a value of 90% IACS or higher.

Examples 38-39: Grain Size of Copper Powder

Other than causing the grain size $d_{50}$ of the copper atomized powder to be 50 μm and 80 μm, respectively, a zirconium coating was formed on the surface of the copper powder by using a barrel sputtering device in the same manner as Example 2. The sputter conditions and the rotation speed of the barrel were adjusted as needed to achieve a thickness of 50 nm.

With regard to the copper powder with the coating formed thereon, the absorption of a laser beam having a wavelength of 1064 nm was measured in the same manner as Example 1. The results are shown in Table 1. It was confirmed that the absorption was higher in all Examples 38-39 in comparison to the copper powder with no coating formed thereon (Comparative Example 1). Furthermore, the respective metal powders were used to produce molded objects in the same manner as Example 1, and the relative density and conductivity thereof were measured. As shown in Table 1, the relative density was 97% or higher and a high density was obtained in all cases, and the conductivity was also favorable in all cases at a value of 90% IACS or higher. Moreover, while a slight decrease in density was observed in the molded objects produced using the unmolded powder, the molded object exhibited favorable conductivity in all cases at a value of 90% IACS or higher.

Examples 40-41: Oxygen Concentration of Copper Powder

Other than causing the oxygen concentration of the copper atomized powder to be 450 wtppm and 200 wtppm, respectively, a zirconium coating was formed on the surface of the copper powder by using a barrel sputtering device in the same manner as Example 2. The sputter conditions and the rotation speed of the barrel were adjusted as needed to achieve a thickness of 50 nm.

With regard to the copper powder with the coating formed thereon, the absorption of a laser beam having a wavelength of 1064 nm was measured in the same manner as Example 1. The results are shown in Table 1. It was confirmed that the absorption was higher in all Examples 40-41 in comparison to the copper powder with no coating formed thereon (Comparative Example 1). Furthermore, the respective metal powders were used to produce molded objects in the same manner as Example 1, and the relative density and conductivity thereof were measured. As shown in Table 1, the relative density was 97% or higher and a high density was obtained in all cases, and the conductivity was also favorable in all cases at a value of 90% IACS or higher. Moreover, while a slight decrease in density was observed in the molded objects produced using the unmolded powder, the molded object exhibited favorable conductivity in all cases at a value of 90% IACS or higher.

Examples 42-61: Copper Alloy Powder

A copper alloy atomized powder (Cu—Cr, Cu—Bi, Cu—W, Cu—Y, Cu—Zr, Cu—Nd) having a grain size $d_{50}$ of 25 μm and an oxygen concentration of 750 wt % was prepared, and a zirconium coating was formed on the surface of the copper alloy powder by using a barrel sputtering device. The sputter conditions and the rotation speed of the barrel were adjusted so as to attain a coating thickness of 100 nm.

With regard to the copper alloy powder with the coating formed thereon, the absorption of a laser beam having a wavelength of 1064 nm was measured in the same manner as Example 1. The results are shown in Table 1. It was confirmed that the absorption was higher in all Examples 42-61 in comparison to the copper alloy powder with no coating formed thereon (Comparative Example 2-7). Furthermore, the respective metal powders were used to produce molded objects in the same manner as Example 1, and the relative density and conductivity thereof were measured. As shown in Table 1, the relative density was 97% or higher and a high density was obtained in all cases, and the conductivity was also favorable in all cases at a value of 90% IACS or higher. Moreover, while a slight decrease in density was observed in the molded objects produced using the unmolded powder, the molded object exhibited favorable conductivity in all cases at a value of 90% IACS or higher.

TABLE 1

| | Cu powder | | | Surface treatment | | | | Molded object | | Molded object formed from unmolded powder | |
|---|---|---|---|---|---|---|---|---|---|---|---|
| | Grain size $d_{50}$ [μm] | Type | Oxygen concentration (wtppm) | Type | Method | Thickness [nm] | Absorptance | Density [%] | Conductivity [% IACS] | Density [%] | Conductivity [% IACS] |
| Example 1 | 25 | Cu | 750 | Zr | Sputter | 5 | 23.2 | 97.1 | 90.7 | 94.2 | 90.6 |
| Example 2 | 25 | Cu | 750 | Zr | Sputter | 50 | 30.2 | 99.2 | 93.7 | 96.2 | 93.6 |
| Example 3 | 25 | Cu | 750 | Zr | Sputter | 100 | 37.8 | 99.8 | 97.8 | 96.8 | 97.7 |
| Example 4 | 25 | Cu | 750 | Zr | Sputter | 300 | 41.2 | 99.9 | 96.8 | 96.9 | 96.7 |
| Example 5 | 25 | Cu | 750 | Zr | Sputter | 500 | 45.2 | 99.7 | 93.5 | 96.7 | 93.4 |
| Example 6 | 25 | Cu | 750 | Gd | Sputter | 100 | 35.6 | 99.5 | 96.2 | 96.5 | 96.1 |
| Example 7 | 25 | Cu | 750 | Ho | Sputter | 100 | 37.2 | 99.3 | 96.5 | 96.3 | 96.4 |
| Example 8 | 25 | Cu | 750 | Lu | Sputter | 100 | 39.4 | 99.7 | 97.6 | 96.7 | 97.5 |
| Example 9 | 25 | Cu | 750 | Mo | Sputter | 100 | 38.6 | 99.8 | 96.5 | 96.8 | 96.4 |
| Example 10 | 25 | Cu | 750 | Nb | Sputter | 100 | 37.6 | 99.5 | 97.8 | 96.5 | 97.7 |
| Example 11 | 25 | Cu | 750 | Os | Sputter | 100 | 36.4 | 99.6 | 96.5 | 96.6 | 96.4 |
| Example 12 | 25 | Cu | 750 | Re | Sputter | 100 | 38.5 | 99.4 | 97.4 | 96.4 | 97.3 |
| Example 13 | 25 | Cu | 750 | Ru | Sputter | 100 | 37.3 | 99.7 | 95.3 | 96.7 | 95.2 |
| Example 14 | 25 | Cu | 750 | Tb | Sputter | 100 | 41.2 | 99.6 | 96.2 | 96.6 | 96.1 |
| Example 15 | 25 | Cu | 750 | Tc | Sputter | 100 | 37.5 | 99.4 | 97.2 | 96.4 | 97.1 |
| Example 16 | 25 | Cu | 750 | Th | Sputter | 100 | 36.7 | 99.6 | 95.6 | 96.6 | 95.5 |
| Example 17 | 25 | Cu | 750 | Tm | Sputter | 100 | 37.5 | 99.7 | 96.8 | 96.7 | 96.7 |
| Example 18 | 25 | Cu | 750 | U | Sputter | 100 | 36.5 | 99.8 | 97.5 | 96.8 | 97.4 |
| Example 19 | 25 | Cu | 750 | V | Sputter | 100 | 38.4 | 99.5 | 97.5 | 96.5 | 97.4 |
| Example 20 | 25 | Cu | 750 | W | Sputter | 100 | 39.6 | 99.5 | 97.5 | 96.5 | 97.4 |
| Example 21 | 25 | Cu | 750 | Y | Sputter | 100 | 36.2 | 99.6 | 96.7 | 96.6 | 96.6 |
| Example 22 | 25 | Cu | 750 | Zr | Sputter | 100 | 38.5 | 99.8 | 97.5 | 96.8 | 97.4 |
| Example 23 | 25 | Cu | 750 | Rh | Sputter | 100 | 37.4 | 99.4 | 98.5 | 96.4 | 98.4 |
| Example 24 | 25 | Cu | 750 | Hf | Sputter | 100 | 39.4 | 99.3 | 91.3 | 96.3 | 91.2 |
| Example 25 | 25 | Cu | 750 | La | Sputter | 100 | 38.4 | 99.6 | 96.3 | 96.6 | 96.2 |
| Example 26 | 25 | Cu | 750 | Ce | Sputter | 100 | 37.3 | 99.5 | 97.4 | 96.5 | 97.3 |
| Example 27 | 25 | Cu | 750 | Pr | Sputter | 100 | 36.4 | 99.6 | 97.5 | 96.6 | 97.4 |
| Example 28 | 25 | Cu | 750 | Nd | Sputter | 100 | 40.2 | 99.7 | 97.8 | 96.7 | 97.7 |
| Example 29 | 25 | Cu | 750 | Pm | Sputter | 100 | 37.1 | 99.5 | 96.5 | 96.5 | 96.4 |
| Example 30 | 25 | Cu | 750 | Sm | Sputter | 100 | 36.3 | 99.8 | 97.4 | 96.8 | 97.3 |
| Example 31 | 25 | Cu | 750 | Cr | Sputter | 100 | 39.1 | 99.6 | 96.3 | 96.6 | 96.2 |
| Example 32 | 25 | Cu | 750 | Cr | Plating | 100 | 40.2 | 99.7 | 95.4 | 96.7 | 95.3 |
| Example 33 | 25 | Cu | 750 | Cr | Chromate treatment | 100 | 45.4 | 99.9 | 93.2 | 96.9 | 93.1 |
| Example 34 | 25 | Cu | 750 | Ru | Plating | 100 | 39.4 | 99.8 | 93.8 | 96.8 | 93.7 |
| Example 35 | 25 | Cu | 750 | Rh | Plating | 100 | 39.4 | 99.6 | 96.4 | 96.6 | 96.3 |
| Example 36 | 25 | Cu | 750 | Os | Plating | 100 | 38.4 | 99.7 | 95.4 | 96.7 | 95.3 |
| Example 37 | 25 | Cu | 750 | Ti | Titanate treatment | 20 | 30.1 | 99.3 | 94.2 | 96.3 | 94.1 |
| Example 38 | 50 | Cu | 750 | Zr | Sputter | 50 | 31.2 | 99.1 | 93.2 | 96.1 | 93.1 |
| Example 39 | 80 | Cu | 750 | Zr | Sputter | 50 | 31.6 | 98.2 | 91.4 | 95.3 | 91.3 |
| Example 40 | 25 | Cu | 450 | Zr | Sputter | 50 | 30 | 99.3 | 94.2 | 96.3 | 94.1 |
| Example 41 | 25 | Cu | 200 | Zr | Sputter | 50 | 29.5 | 99.5 | 95.3 | 96.5 | 95.2 |
| Example 42 | 25 | Cu—Cr1 at % | 750 | Zr | Sputter | 100 | 43.8 | 99.8 | 94.3 | 96.8 | 94.2 |
| Example 43 | 25 | Cu—Bi1 at % | 750 | Zr | Sputter | 100 | 44.5 | 99.9 | 93.2 | 96.9 | 93.1 |
| Example 44 | 25 | Cu—W1 at % | 750 | Zr | Sputter | 100 | 42.5 | 99.8 | 94.5 | 96.8 | 94.4 |
| Example 45 | 25 | Cu—Y1 at % | 750 | Zr | Sputter | 100 | 43.5 | 99.8 | 92.1 | 96.8 | 92.0 |
| Example 46 | 25 | Cu—Zr1 at % | 750 | Zr | Sputter | 100 | 44.5 | 99.9 | 92.4 | 96.9 | 92.3 |

TABLE 1-continued

| | | Cu powder | | Surface treatment | | | | Molded object | | Molded object formed from unmolded powder | |
| | Grain size d50 [μm] | Type | Oxygen concentration (wtppm) | Type | Method | Thickness [nm] | Absorptance | Density [%] | Conductivity [% IACS] | Density [%] | Conductivity [% IACS] |
|---|---|---|---|---|---|---|---|---|---|---|---|
| Example 47 | 25 | Cu—Nd1 at % | 750 | Zr | Sputter | 100 | 42.5 | 99.8 | 93.5 | 96.8 | 93.4 |
| Example 48 | 25 | Cu—W1 at % | 750 | W | Sputter | 100 | 45.2 | 99.9 | 92.5 | 96.9 | 92.4 |
| Example 49 | 25 | Cu—Y1 at % | 750 | W | Sputter | 100 | 45.8 | 99.9 | 93.5 | 96.9 | 93.4 |
| Example 50 | 25 | Cu—Zr1 at % | 750 | W | Sputter | 100 | 46.2 | 99.9 | 92.5 | 96.9 | 92.4 |
| Example 51 | 25 | Cu—W1 at % | 750 | Mo | Sputter | 100 | 46.8 | 99.9 | 93.5 | 96.9 | 93.4 |
| Example 52 | 25 | Cu—Y1 at % | 750 | Mo | Sputter | 100 | 45.7 | 99.9 | 94.5 | 96.9 | 94.4 |
| Example 53 | 25 | Cu—Zr1 at % | 750 | Mo | Sputter | 100 | 46.3 | 99.8 | 93.5 | 96.8 | 93.4 |
| Example 54 | 25 | Cu—Zr0.5 at % | 750 | W | Sputter | 100 | 40.3 | 99.8 | 95.5 | 96.8 | 95.4 |
| Example 55 | 25 | Cu—W0.5 at % | 750 | W | Sputter | 100 | 41.2 | 99.8 | 95.6 | 96.8 | 95.5 |
| Example 56 | 25 | Cu—Zr0.5 at % | 750 | Mo | Sputter | 100 | 40.8 | 99.9 | 95.7 | 96.9 | 95.6 |
| Example 57 | 25 | Cu—W0.5 at % | 750 | Mo | Sputter | 100 | 41.7 | 99.7 | 96.2 | 96.7 | 96.1 |
| Example 58 | 25 | Cu—Zr0.2 at % | 750 | W | Sputter | 100 | 39.3 | 99.8 | 96.5 | 96.8 | 96.4 |
| Example 59 | 25 | Cu—W0.2 at % | 750 | W | Sputter | 100 | 40.2 | 99.8 | 96.7 | 96.8 | 96.6 |
| Example 60 | 25 | Cu—Zr0.2 at % | 750 | Mo | Sputter | 100 | 39.8 | 99.9 | 97 | 96.9 | 96.9 |
| Example 61 | 25 | Cu—W0.2 at % | 750 | Mo | Sputter | 100 | 40.7 | 99.7 | 97.2 | 96.7 | 97.1 |

Comparative Examples 1-7: Uncoated Copper Powder or Copper Alloy Powder

A copper or copper alloy (Cu—Cr, Cu—Bi, Cu—W, Cu—Y, Cu—Zr, Cu—Nd) atomized powder having a grain size $d_{50}$ of 25 μm and an oxygen concentration of 750 wt % was prepared.

With regard to this copper or copper alloy powder, the bsorbance of a laser beam having a wavelength of 1064 nm was measured in the same manner as Example 1. The results are shown in Table 2. The absorption was roughly 13 to 27% in all Comparative Examples 1-7. Moreover, the respective metal powders were used to produce molded objects in the same manner as Example 1, and the relative density and conductivity thereof were measured. As shown in Table 2, the relative density was roughly 83 to 95% in all cases, and the density was lower in comparison to cases where a coating was formed. Furthermore, the conductivity was roughly 85% IACS, and the conductivity was also lower in comparison to cases where a coating was formed.

Comparative Examples 8-12: Type of Metal of Surface Coating

A copper atomized powder having a grain size $d_{50}$ of 25 μm and an oxygen concentration of 750 wt % was prepared, and a metal (Ni, Co, Zn, Au, Ag) coating was each formed on the surface of the copper powder by using a barrel sputtering device. The sputter conditions and the rotation speed of the barrel were adjusted so as to attain a coating thickness of 100 nm.

Moreover, the respective metal powders were used to produce molded objects in the same manner as Example 1, and the relative density and conductivity thereof were measured. As shown in Table 2, the conductivity was roughly 85% IACS, and the conductivity was lower in comparison to cases where the coating of Examples 6-31 was formed.

Comparative Examples 13-14: Thickness of Surface Coating

A copper atomized powder having a grain size $d_{50}$ of 25 μm and an oxygen concentration of 750 wt % was prepared, and a zirconium coating was formed on the surface of the copper powder by using a barrel sputtering device. Here, the sputter conditions and the rotation speed of the barrel were adjusted so as to attain a coating thickness of 2 nm and 700 nm, respectively. With regard to these metal powders, the absorption of a laser beam having a wavelength of 1064 nm was measured in the same manner as Example 1. The results are shown in Table 2. The absorption was roughly 17% in Comparative Example 13 where the thickness was set to 2 nm. Furthermore, the respective metal powders were used to produce molded objects in the same manner as Example 1, and the relative density and conductivity thereof were measured. As shown in Table 2, the conductivity was roughly 88% IACS in Comparative Example 14 where the thickness was set to 700 nm, and the conductivity deteriorated.

TABLE 2

| | Cu powder | | | Surface treatment | | | | Molded object | |
| | Grain size d50 [μm] | Type | Oxygen concentration (wtppm) | Type | Method | Thickness [nm] | Absorptance | Density [%] | Conductivity [% IACS] |
|---|---|---|---|---|---|---|---|---|---|
| Comparative Example 1 | 25 | Cu | 750 | None | — | — | 13 | 83.5 | 95.6 |
| Comparative Example 2 | 25 | Cu—Cr1 at % | 750 | None | — | — | 23.7 | 95.6 | 87.8 |
| Comparative Example 3 | 25 | Cu—Bi1 at % | 750 | None | — | — | 24.6 | 96.3 | 84.5 |
| Comparative Example 4 | 25 | Cu—W1 at % | 750 | None | — | — | 23.7 | 95.7 | 83.4 |
| Comparative Example 5 | 25 | Cu—Y1 at % | 750 | None | — | — | 24.7 | 95.4 | 82.4 |
| Comparative Example 6 | 25 | Cu—Zr1 at % | 750 | None | — | — | 26.1 | 95.6 | 84.5 |
| Comparative Example 7 | 25 | Cu—Nd1 at % | 750 | None | — | — | 27.1 | 94.3 | 83.2 |

TABLE 2-continued

|  | Cu powder | | Oxygen concentration (wtppm) | Surface treatment | | | | Molded object | |
|---|---|---|---|---|---|---|---|---|---|
|  | Grain size d50 [μm] | Type |  | Type | Method | Thickness [nm] | Absorptance | Density [%] | Conductivity [% IACS] |
| Comparative Example 8 | 25 | Cu | 750 | Ni | Sputter | 100 | 40.7 | 99.7 | 85.2 |
| Comparative Example 9 | 25 | Cu | 750 | Co | Sputter | 100 | 39.6 | 99.5 | 87.4 |
| Comparative Example 10 | 25 | Cu | 750 | Zn | Sputter | 100 | 38.7 | 99.6 | 83.1 |
| Comparative Example 11 | 25 | Cu | 750 | Au | Sputter | 100 | 14.1 | 94.3 | 84.3 |
| Comparative Example 12 | 25 | Cu | 750 | Ag | Sputter | 100 | 14.7 | 95.1 | 85.7 |
| Comparative Example 13 | 25 | Cu | 750 | Zr | Sputter | 2 | 17.1 | 96.5 | 87.2 |
| Comparative Example 14 | 25 | Cu | 750 | Zr | Sputter | 700 | 44.2 | 99.6 | 88.7 |

The metal powder of the present invention can increase absorption of a laser beam and can be efficiently melted with a laser by a specific metal coating being formed on the surface of the copper or copper alloy powder, and can further maintain the high conductivity of copper or copper alloy. The metal powder of the present invention is useful as a metal powder for metal additive manufacturing based on the laser method for producing metal components having a complex shape and which are particularly demanded of high conductivity and high density (heat sinks and heat exchangers used for heat radiation, connector materials for use in electronic parts, etc.).

The invention claimed is:

1. A metal powder comprising particles of a copper or a copper alloy powder and a coating formed on a surface of each of the particles, wherein the copper or copper alloy powder has a grain size $d_{50}$ of 20 μm or more and 100 μm or less, and wherein the coating consists of one or more elements selected from the group consisting of Gd, Ho, Lu, Mo, Nb, Os, Re, Ru, Tb, Tc, Th, Tm, U, V, W, Y, Cr, Rh, Hf, La, Ce, Pr, Nd, Pm, Sm and Ti and has a thickness of 5 nm or more and 500 nm or less.

2. The metal powder according to claim 1, wherein an oxygen concentration of the copper or copper alloy powder is 1000 wtppm or less.

3. A metal laminate molded object produced by using the metal powder according to claim 1, wherein a conductivity of the metal laminate molded object is 90% IACS or higher.

4. The metal laminate molded object according to claim 3, wherein a relative density of the metal laminate molded object is 97% or higher.

5. The metal powder according to claim 1, wherein the particles of a copper or a copper alloy powder include particles of a copper alloy powder, and wherein a copper alloy of the copper alloy powder contains one or more alloy elements selected from the group consisting of Cr, Bi, W, Y, Zr, and Nd in a total amount of 12 at % or less.

6. The metal powder according to claim 1, wherein the particles consist of copper alloy powder, and wherein the copper alloy powder consists of copper and one or more alloy elements selected from the group consisting of Cr, Bi, W, Y, Zr, and Nd in a total amount of 12 at % or less.

7. The metal powder according to claim 1, wherein the coating consists of a plated layer.

8. The metal powder according to claim 1, wherein the coating consists of a thin film formed by barrel sputter deposition.

9. A metal powder comprising particles of a copper or a copper alloy powder and a coating formed on a surface of each of the particles, wherein the copper or copper alloy powder has a grain size $d_{50}$ of 20 μm or more and 100 μm or less, wherein the coating consists of one or more elements selected from the group consisting of Gd, Ho, Lu, Mo, Nb, Os, Re, Ru, Tb, Tc, Th, Tm, U, V, W, Y, Zr, Cr, Rh, Hf, La, Ce, Pr, Nd, Pm, Sm and Ti and has a thickness of 5 nm or more and 500 nm or less, wherein the metal powder consists of the particles and the coating formed on the surface of each of the particles, and wherein the coating formed on the surface of each of the particles consists of a single coating layer.

10. The metal powder according to claim 9, wherein an oxygen concentration of the copper or copper alloy powder is 1000 wtppm or less.

11. A metal laminate molded object produced by using the metal powder according to claim 9, wherein a conductivity of the metal laminate molded object is 90% IACS or higher.

12. The metal laminate molded object according to claim 11, wherein a relative density of the metal laminate molded object is 97% or higher.

13. The metal powder according to claim 9, wherein the particles of a copper or a copper alloy powder include particles of a copper alloy powder, and wherein a copper alloy of the copper alloy powder contains one or more alloy elements selected from the group consisting of Cr, Bi, W, Y, Zr, and Nd in a total amount of 12 at % or less.

14. The metal powder according to claim 9, wherein the particles consist of copper alloy powder, and wherein the copper alloy powder consists of copper and one or more alloy elements selected from the group consisting of Cr, Bi, W, Y, Zr, and Nd in a total amount of 12 at % or less.

15. The metal powder according to claim 9, wherein the coating consists of a plated layer.

16. The metal powder according to claim 11, wherein the coating consists of a thin film formed by barrel sputter deposition.

* * * * *